(12) United States Patent
Murahari et al.

(10) Patent No.: US 10,102,984 B2
(45) Date of Patent: Oct. 16, 2018

(54) CURRENT SENSE TECHNIQUES FOR ARC FAULT AND GROUND FAULT RECEPTACLES

(71) Applicant: EATON CORPORATION, Cleveland, OH (US)

(72) Inventors: Saivaraprasad Murahari, Peachtree City, GA (US); Jian Guo Chen, Shanghai (CN); Hongzhi Zhou, Dongguan (CN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 267 days.

(21) Appl. No.: 15/221,877

(22) Filed: Jul. 28, 2016

(65) Prior Publication Data

US 2018/0033569 A1 Feb. 1, 2018

(51) Int. Cl.
*H02H 9/02* (2006.01)
*H01H 9/50* (2006.01)
*G01R 19/10* (2006.01)
*G01R 31/02* (2006.01)
*G01R 31/12* (2006.01)

(52) U.S. Cl.
CPC .............. *H01H 9/50* (2013.01); *G01R 19/10* (2013.01); *G01R 31/025* (2013.01); *G01R 31/1272* (2013.01)

(58) Field of Classification Search
USPC .......................................................... 361/42
See application file for complete search history.

(56) References Cited

U.S. PATENT DOCUMENTS

| 6,191,589 B1* | 2/2001 | Clunn | G01R 15/183 324/127 |
| 6,426,632 B1* | 7/2002 | Clunn | G01R 15/183 324/424 |
| 8,542,021 B2* | 9/2013 | Scott | H02H 1/0015 324/509 |
| 8,599,523 B1* | 12/2013 | Ostrovsky | G01R 31/025 361/45 |
| 2013/0128396 A1* | 5/2013 | Danesh | G01R 19/00 361/45 |
| 2015/0333498 A1* | 11/2015 | Weeks | H02H 3/06 361/42 |
| 2017/0269139 A1* | 9/2017 | Schmalz | G01R 31/025 |

* cited by examiner

*Primary Examiner* — Ronald W Leja
(74) *Attorney, Agent, or Firm* — Eckert Seamans

(57) ABSTRACT

The disclosed concept relates generally to current sense techniques and apparatus for arc fault and ground fault receptacles, e.g., circuit interrupters, and, more particularly, to arc fault and ground fault receptacles including a shunt stationary terminal exhibiting both mechanical and electrical functionality. The shunt stationary terminal is composed of a steel or steel alloy and copper or copper alloy composite having a current shunt integrated therein.

12 Claims, 4 Drawing Sheets

CURRENT SENSE TECHNIQUES FOR ARC FAULT AND GROUND FAULT RECEPTACLES

BACKGROUND OF THE INVENTION

1. Field of the Invention

The disclosed concept relates generally to current sense techniques and apparatus for arc fault and ground fault receptacles, e.g., circuit interrupters, and, more particularly, to arc fault and ground fault receptacles including a stationary terminal exhibiting both mechanical and electrical functionality.

2. Description of the Prior Art

Arc fault receptacles, e.g., circuit interrupters, are known in the art and, generally, are designed to recognize an arc fault and quickly trip to stop the flow of electricity to prevent the electrical system from being an ignition source of a fire.

Load current is typically measured using a shunt resistance. That is, current flowing through a shunt branch, e.g., shunt wire, is measured. FIG. 1 shows an arc fault receptacle 1 in accordance with the prior art. FIG. 1 includes a neutral assembly load terminal 3, a hot assembly load terminal 5, a transformer insert 7, a neutral stationary terminal 9, a hot stationary terminal 11 and a shunt wire 13. One end of the shunt wire 13 is coupled, e.g., typically by soldering, to the hot stationary terminal 11. The other end of the shunt wire 13 is coupled, e.g., typically by soldering, to a PCB (not shown). Voltage is measured across the shunt wire 13. Thus, the stationary terminals 9,11 provide electrical and mechanical functions, and the shunt wire 13 provides an electrical function.

It is an object of the disclosed concept to integrate a current shunt into the stationary terminal, such that a separate or individual current shunt, e.g., shunt wire, is omitted from the design of the receptacle and, the stationary terminal provides both mechanical and electrical functionality. It is a further object to determine load current by measuring the voltage difference between two points positioned on the stationary terminal.

SUMMARY OF THE INVENTION

In one aspect, the disclosed concept provides an arc fault or ground fault receptacle, including a shunt stationary terminal and a load terminal. The shunt stationary terminal has a current shunt integrated therein. The shunt stationary terminal includes a steel or steel alloy and copper or copper alloy composite. A first point is positioned at one end of the shunt stationary terminal to provide a first voltage measurement, and a second point is positioned at an opposite end of the shunt stationary terminal to provide a second voltage measurement. A difference between the first voltage measurement and the second voltage measurement is used to determine current flow. The stationary terminal and a current shunt is integrated into the shunt stationary terminal, and excludes a separate current shunt branch.

The fault receptacle assembly can be positioned within a circuit interrupter.

The steel or steel alloy and copper or copper alloy multi-layer composite can include a steel or steel alloy substrate having a top surface and a bottom surface, a first copper or copper alloy layer connected to the top surface, and a second copper or copper alloy layer connected to the bottom surface.

The shunt stationary terminal can provide mechanical and electrical functionality to the receptacle assembly. The fault receptacle assembly excludes a separate shunt wire. The shunt stationary terminal can serve as a neutral stationary terminal and current shunt branch. Alternately, the shunt stationary terminal can serve as a hot stationary terminal and current shunt branch.

Another aspect of the disclosed concept provides a method of measuring load current of an arc fault receptacle or ground fault receptacle. The method includes providing a steel or steel alloy and copper or copper alloy multi-layer composite; forming the multi-layer composite into a single shunt stationary terminal, which serves as a stationary terminal and a current shunt; identifying a first point at one end of the single shunt stationary terminal; obtaining a first voltage measurement at the first point; identifying a second point at an opposite end of the single shunt stationary terminal; obtaining a second voltage measurement at the second point; determining a difference between the first and second voltage measurements; and converting the difference to a current flow measurement.

The forming of the single shunt stationary terminal can include stamping it out of the steel or steel alloy and copper or copper alloy multi-layer composite.

Further, the forming of the multi-layer composite into the single shunt stationary terminal can include providing a first substrate and a second substrate, each being composed of copper or copper alloy; providing a third substrate composed of steel or steel alloy; positioning the third substrate between the first and second substrates; rolling together the first, second and third substrates to form a rolled configuration, heating the rolled configuration to form a heated, rolled configuration; and pressing the heated, rolled configuration to form the multi-layer composite. The rolling, heating and pressing steps are optionally repeated to achieve the multi-layer composite having a desired thickness. In certain embodiments, the desired thickness is about 50% of a total starting thickness of the first, second and third substrates. Furthermore, the desired thickness of the multi-layer composite can be from about 0.20 mm to about 0.30 mm.

DESCRIPTION OF THE PREFERRED EMBODIMENTS

Figure 1:
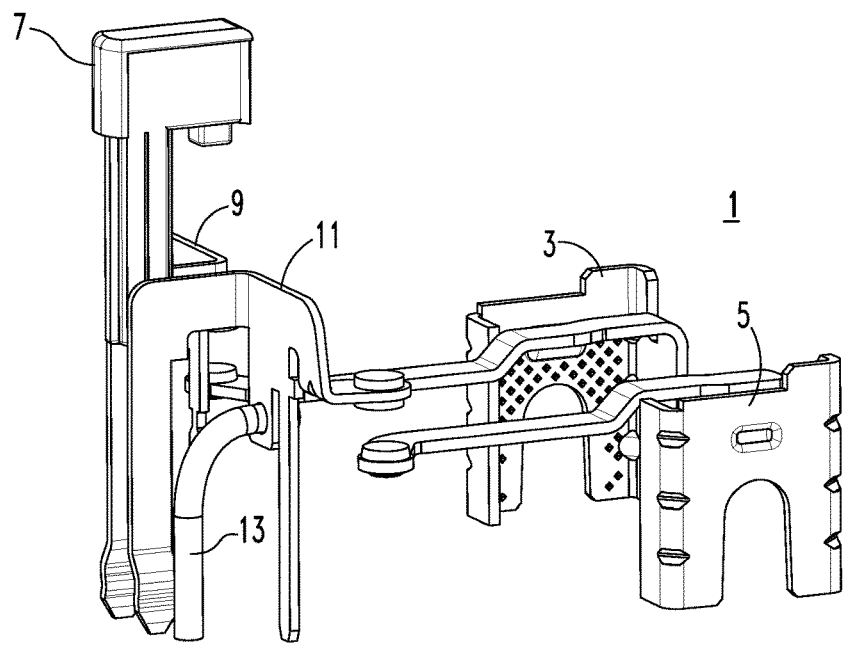
FIG. 1 is a schematic showing an arc fault receptacle having a shunt wire, in accordance with certain embodiments of the prior art.

The disclosed concept relates to circuit interrupters in general, and more particularly, to arc fault and ground fault receptacles. In accordance with the disclosed concept, the design of these receptacles does not include a separate or individual current shunt branch, e.g., shunt wire. As previously described herein, it is known in the art for such receptacles to include a shunt wire, e.g., separate from and in addition to a stationary terminal, for the purpose of measuring current. That is, conventional arc fault and ground fault receptacles include a stationary terminal component and a separate current shunt component. In accordance with the disclosed concept, these two individual components are combined into, or replaced with, a single, integrated component. The material composition of a conventional or an existing stationary terminal is modified such that it is capable to measure current. Thus, a current shunt branch and a stationary terminal (either a neutral stationary terminal or a hot stationary terminal) are integrated together to form a single piece or part. It is contemplated that either of the existing hot or neutral stationary terminals and a shunt branch of a prior art receptacle, may be modified to provide the single component shunt stationary terminal, in accordance with the disclosed concept. For example, FIG. 1 shows a conventional hot stationary terminal 11 and a shunt wire 13. However, the shunt wire may alternately be connected to the conventional neutral stationary terminal 9. As a result, the single component shunt stationary terminal is capable of providing both mechanical and electrical functionality. In order to accomplish this result, the material composition of the existing stationary terminal is modified. The single shunt stationary terminal is composed of a multi-layer composite including steel or steel alloy and copper or copper alloy. In certain embodiments, the composite includes a substrate of steel or steel alloy having a top surface and a bottom surface, and a copper or copper alloy layer is applied, e.g., bonded, to each of the top and bottom surfaces of the steel or steel alloy substrate.

Figure 2:
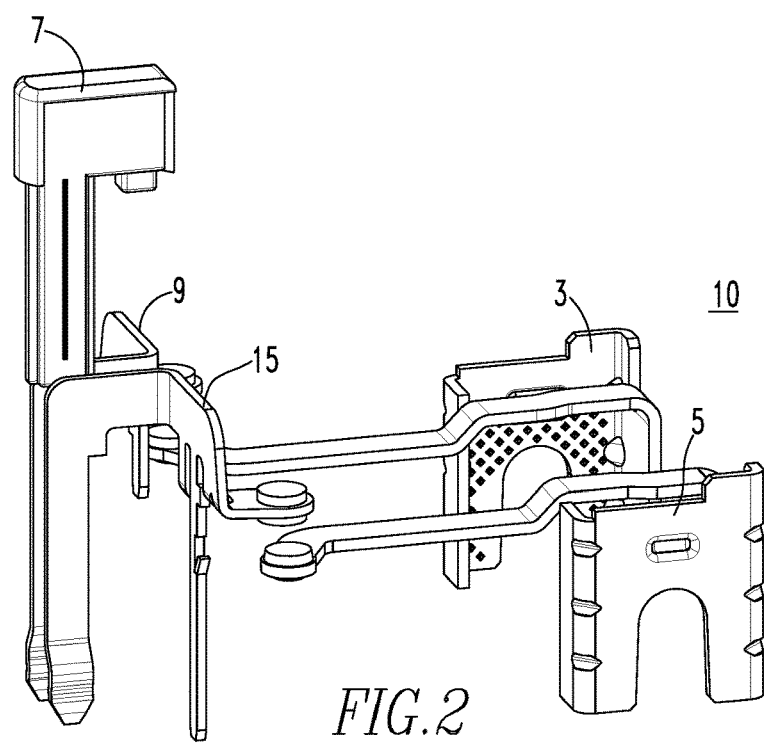
FIG. 2 is a schematic showing an arc fault receptacle having a current shunt integrated into a stationary terminal of the arc fault receptacle, in accordance with certain embodiments of the disclosed concept.

FIG. 2 shows an arc fault receptacle 10 in accordance with certain embodiments of the disclosed concept. FIG. 2 includes the neutral assembly load terminal 3, the hot assembly load terminal 5, the transformer insert 7 and the neutral stationary terminal 9, as shown in FIG. 1. In addition, FIG. 2 shows a shunt stationary terminal 15. This single component, i.e., the shunt stationary terminal 15, replaces the conventional hot stationary terminal 11 and shunt wire 13 components shown in FIG. 1. That is, FIG. 2 does not include a separate or individual current shunt branch, i.e., shunt wire 13. The single component shunt stationary terminal 15 provides both the mechanical and electrical functionality, and is composed of a steel or steel alloy and copper or copper alloy composite. Replacement of the conventional hot stationary terminal 11 and shunt wire 13 is exemplary and in accordance with the disclosed concept. It is contemplated and understood that a conventional neutral stationary terminal and shunt wire may be replaced with a single component shunt stationary terminal. That is, alternately, the neutral stationary terminal 9 shown in FIG. 1 may include a separate shunt branch and in accordance with the disclosed concept, the neutral stationary terminal 9 (in FIG. 2) may be modified to provide a shunt stationary terminal (instead of the shunt stationary terminal 15, shown in FIG. 2).

Figure 3:
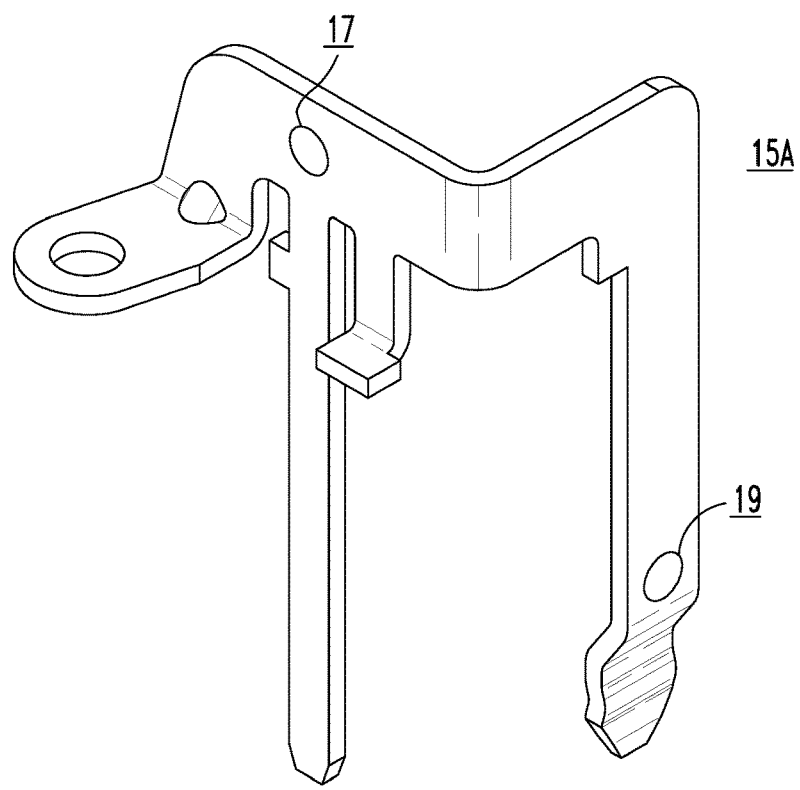
FIG. 3 is a schematic showing a stationary terminal, in accordance with certain embodiments of the disclosed concept.

FIG. 3 shows a detailed view of a shunt stationary terminal 15A, in accordance with certain embodiments of the invention. In addition, FIG. 3 shows a first point 17 and a second point 19. Voltage is measured at each of the first and second points 17,19. The change, e.g., difference, in voltage between these two points is determined. The voltage difference is then converted to a current measurement to determine current load. Conversion of voltage to current employs conventional methods and formulas that are known in the art. As previously mentioned, in accordance with the disclosed concept, current load of an arc fault or ground fault receptacle can be measured in the absence of determining the shunt resistance of a separate current shunt component.

Figure 4:
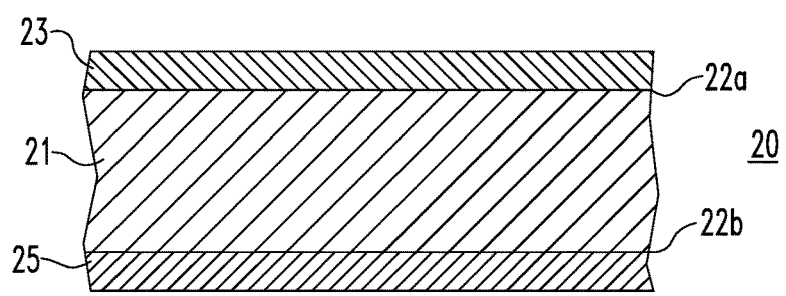
FIG. 4 is a schematic showing a composite material for use in producing the stationary terminal having a current shunt integrated therein, in accordance with certain embodiments of the disclosed concept.

FIG. 4 is a schematic showing a steel or steel alloy and copper or copper alloy multi-layer composite 20, in accordance with certain embodiments of the disclosed concept. The composite 20 includes a steel or steel alloy substrate 21 having a top surface 22a and a bottom surface 22b. Applied to each of the top and bottom surfaces 22a,22b is a copper or copper alloy substrate 23,25, respectively. Various known apparatus and techniques can be employed to produce the multi-layer composites for use in the disclosed concept. In certain embodiments, a hot bonding process can be employed, which includes the use of high force or pressure and high temperatures to apply, e.g., bond, each of the copper or copper alloy layers, e.g., substrates 23,25, to the steel or steel alloy layer, e.g., substrate 21.

In certain embodiments, the steel or steel alloy and copper or copper alloy substrates are in the form of sheets. Further, the single component shunt stationary terminal, e.g. composite 20, of the disclosed concept can be produced by conventional stamping techniques. That is, the shape of the shunt stationary terminal can be stamped out of the steel or steel alloy and copper or copper alloy composite which includes a sheet of steel or steel alloy positioned between two sheets of copper or copper alloy.

It is contemplated and understood that the shunt resistance of the shunt stationary terminal according to the disclosed concept can be controlled or tuned, e.g., increased or decreased, by increasing or decreasing the thickness of each of the steel or steel alloy and/or copper or copper alloy layers of the multi-layer composite. For example, increasing the thickness of the copper or copper alloy layers can result in higher or increased resistance and, for example, increasing the thickness of the steel or steel alloy layer can result in lower or decreased resistance. Furthermore, in certain embodiments, the thickness of the multi-layer composite, including steel or steel alloy and copper or copper alloy substrates/sheets is from about 0.20 to about 0.30 mm.

In certain embodiments, the multi-layer composite is produced by obtaining two layers (or substrates) of copper or copper alloy and one layer (or substrate) of steel or steel alloy, positioning the three layers such that the steel or steel alloy is "sandwiched" between the layers of cooper or copper alloy, rolling together the layers of steel or steel alloy and copper or copper alloy to form a rolled configuration, heating the layers of steel or steel alloy and copper or copper alloy, e.g., the rolled configuration, in an oven to a temperature between about 750° C. and 1000° C. to produce a heated, rolled configuration, and applying a force to the heated, rolled configuration so as to press the layers together to form the multi-layer composite. The resulting multi-layer composite has a thickness, which can vary depending on the starting thickness of each of the layers and, the rolling, heating and pressing steps. In certain embodiments, it is desirable for the thickness of the multi-layer composite to be about 50% of the total original or starting thickness of the copper or copper alloy and steel or steel alloy layers. If this thickness is achieved after a first cycle of rolling, heating and pressing, then the process is complete. However, if the desired thickness is not achieved after the first cycle, one or more additional cycle(s) of rolling, heating and pressing the layers, are repeated until the desired thickness, and hence, a desired resistance, is achieved.

Figure 5A:
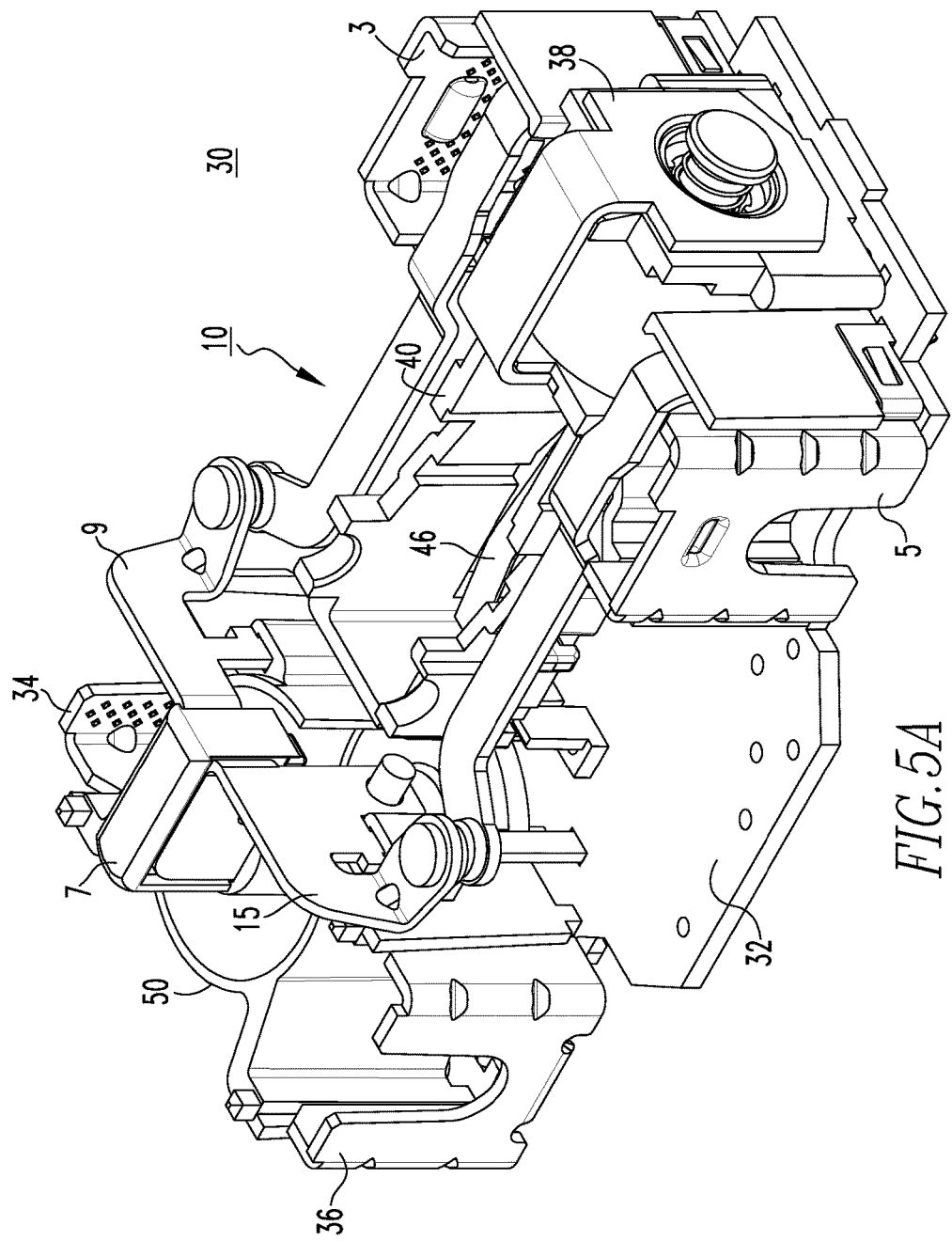
FIGS. 5A and 5B are schematics showing a circuit interrupter, in accordance with certain embodiments of the disclosed concept.
Figure 5B:
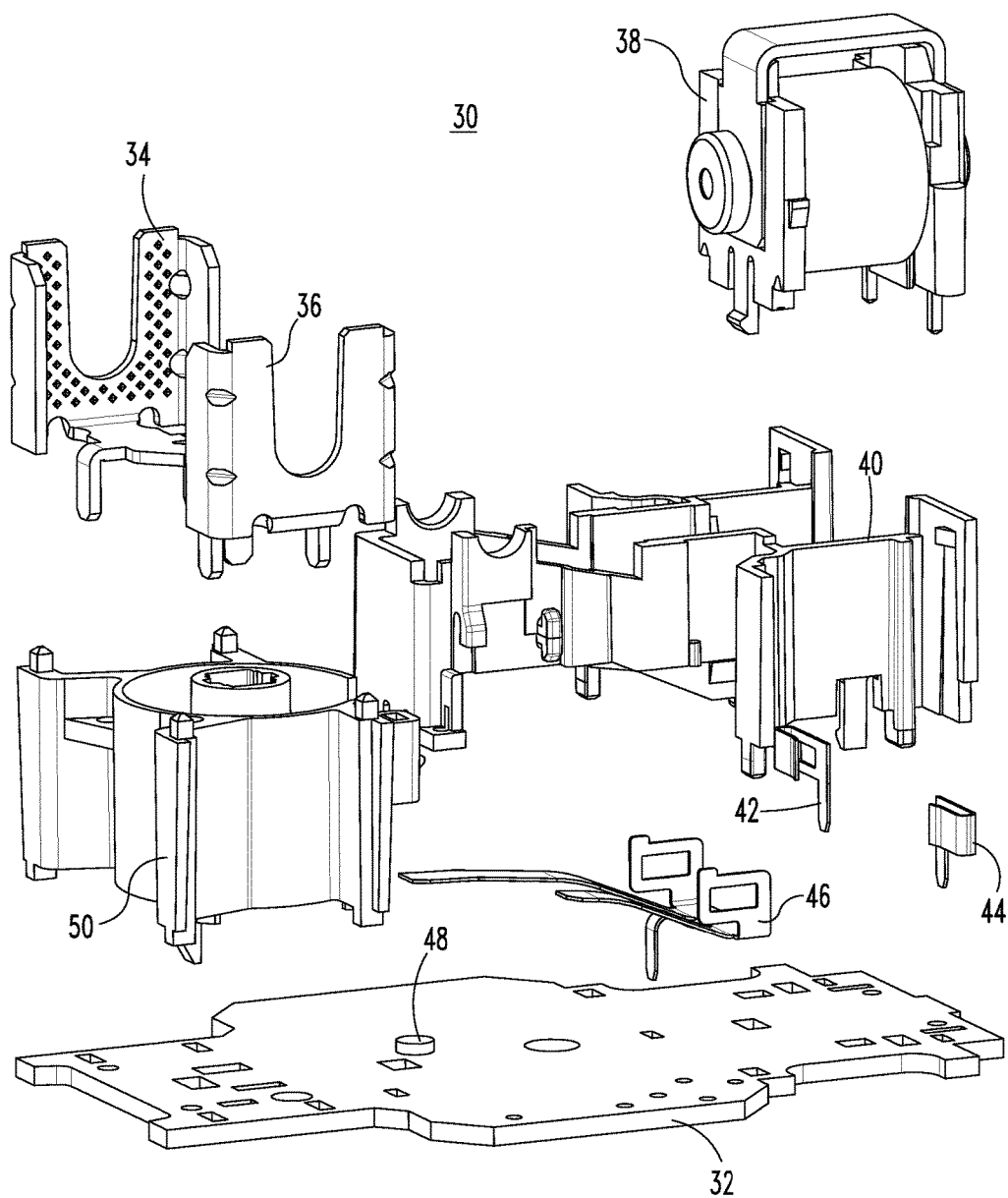

FIG. 5A shows a circuit interrupter 30, in accordance with certain embodiments of the disclosed concept. The circuit interrupter 30 includes the arc fault receptacle 10 including the neutral assembly load terminal 3, the hot assembly load terminal 5, the transformer insert 7, the neutral stationary terminal 9, and the shunt stationary terminal 15 (as shown in FIG. 2) and a PCB assembly 32. In addition, FIG. 5A includes a neutral line terminal 34, a hot line terminal 36, a solenoid assembly 38, a solenoid frame 40, a test switch 46, and a transformer boat 50. Further, FIG. 5B shows a deconstructed view of the circuit interrupter 30 including the neutral line terminal 34, the hot line terminal 36, the solenoid assembly 38, the solenoid frame 40, the test switch 46, and the transformer boat 50. In addition, FIG. 5B shows a neutral contact terminal 42, a hot contact terminal 44, and a contact 48 on the PCB assembly 32.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An arc fault or ground fault receptacle assembly, comprising:
   a load terminal;
   a shunt stationary terminal composed of a steel or steel alloy and copper or copper alloy multi-layer composite;
   a first point positioned at one end of the shunt stationary terminal to provide a first voltage measurement; and
   a second point positioned at an opposite end of the shunt stationary terminal to provide a second voltage measurement,
   wherein, a current shunt is integrated into the shunt stationary terminal, excluding a separate current shunt branch, and
   wherein a difference between the first voltage measurement and the second voltage measurement is used to determine current flow.

2. The assembly of claim 1, wherein the receptacle assembly is positioned within a circuit interrupter.

3. The assembly of claim 1, wherein the steel or steel alloy and copper or copper alloy multi-layer composite comprises:
   a steel or steel alloy substrate having a top surface and a bottom surface;
   a first copper or copper alloy layer connected to the top surface; and
   a second copper or copper alloy layer connected to the bottom surface.

4. The assembly of claim 1, wherein the shunt stationary terminal provides mechanical and electrical functionality to the receptacle assembly.

5. The assembly of claim 1, wherein the receptacle assembly excludes a separate shunt wire.

6. The assembly of claim 1, wherein the shunt stationary terminal serves as a neutral stationary terminal and current shunt branch.

7. The assembly of claim 1, wherein the shunt stationary terminal serves as a hot stationary terminal and current shunt branch.

8. A method of measuring load current of an arc fault receptacle or ground fault receptacle, comprising:
   preparing a steel or steel alloy and copper or copper alloy multi-layer composite;
   forming the multi-layer composite into a single shunt stationary terminal, which serves as a stationary terminal and a current shunt;
   identifying a first point at one end of the single shunt stationary terminal;
   obtaining a first voltage measurement at the first point;
   identifying a second point at an opposite end of the single shunt stationary terminal;
   obtaining a second voltage measurement at the second point;
   determining a difference between the first and second voltage measurements; and
   converting the difference to a current flow measurement.

9. The method of claim 8, wherein the forming of the single shunt stationary terminal comprises stamping it out of the steel or steel alloy and copper or copper alloy multi-layer composite, which comprises a sheet of steel or steel alloy positioned between two sheets of copper or copper alloy.

10. The method of claim 8, wherein the forming the multi-layer composite into a single shunt stationary terminal, comprises:
    providing a first substrate and a second substrate each being composed of copper or copper alloy;
    providing a third substrate being composed of steel or steel alloy;
    positioning the third substrate between the first and second substrates;
    rolling together the first, second and third substrates to form a rolled configuration;
    heating the rolled configuration to form a heated, rolled configuration; and
    pressing together the heated, rolled configuration to form the multi-layer composite; and
    optionally repeating the rolling, heating and pressing steps to achieve a desired thickness of the multi-layer composite.

11. The method of claim 10, wherein the desired thickness is about 50% of a starting total thickness of the first, second and third substrates.

12. The method of claim 8, wherein the multi-layer composite has a total thickness from about 0.20 mm to about 0.30 mm.

* * * * *